(12) United States Patent
Okazaki

(10) Patent No.: US 6,556,023 B2
(45) Date of Patent: Apr. 29, 2003

(54) APPARATUS AND METHOD FOR MEASURING ELECTROMAGNETIC RADIATION

(75) Inventor: Masahiro Okazaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/872,318

(22) Filed: Jun. 1, 2001

(65) Prior Publication Data

US 2001/0052779 A1 Dec. 20, 2001

(30) Foreign Application Priority Data

Jun. 1, 2000 (JP) ........................................ 2000-164380

(51) Int. Cl.$^7$ ............................................... G01R 27/04
(52) U.S. Cl. ...................................... 324/637; 343/763
(58) Field of Search ................................. 324/642, 637, 324/326–329, 301–310, 251–262, 250, 76.56, 76.19–76.27, 629–644; 343/703, 756, 761, 763–766, 878, 882; 342/1–5, 360; 333/261–263

(56) References Cited

U.S. PATENT DOCUMENTS 4,968,983 A * 11/1990 Maeda ........................ 343/703

* cited by examiner

Primary Examiner—N. Le
Assistant Examiner—Amy He
(74) Attorney, Agent, or Firm—Robert J. Depke; Holland & Knight LLC

(57) ABSTRACT

Systems and methods provide quick and accurate automated measurement of electromagnetic radiation from a device. A rotary drive rotates an electronic equipment unit and rotation of the equipment is periodically stopped during which time a reception element is traversed across a range of motion that is parallel to an axis of rotation of the electronic equipment. The electromagnetic radiation is evaluated over the range of motion for the reception element at each of a plurality of fixed rotational locations for the electronic equipment.

6 Claims, 13 Drawing Sheets

FIG.3
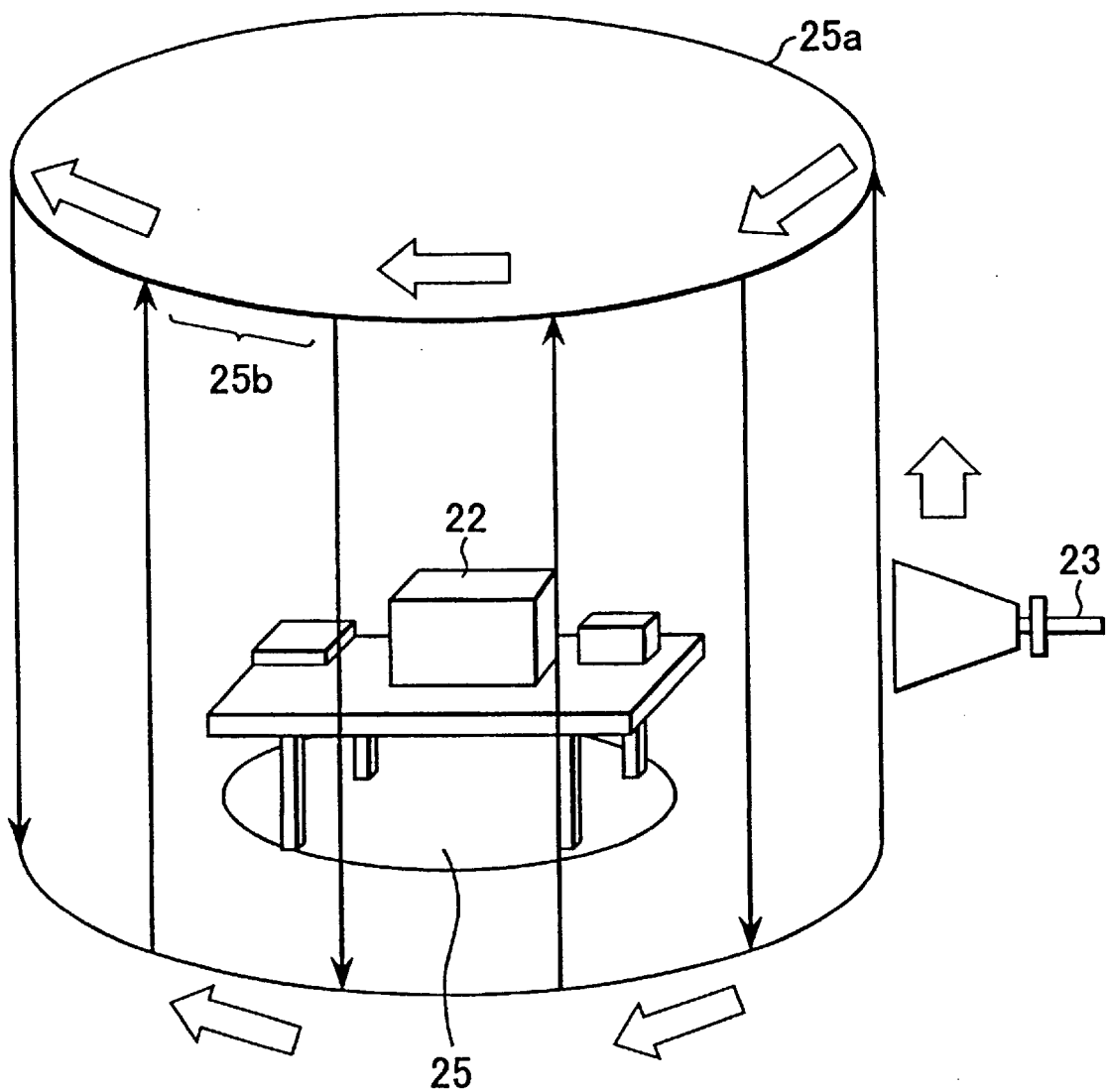

APPARATUS AND METHOD FOR MEASURING ELECTROMAGNETIC RADIATION

BACKGROUND OF THE INVENTION

1. Field of the Invention

This invention relates principally to an electromagnetic radiation measuring apparatus and its electromagnetic radiation measuring method for measuring the strength of radiation emanating from electronic equipment, and more particularly, to an electromagnetic radiation measuring apparatus and its electromagnetic radiation measuring method suited for measuring an electromagnetic radiation of over 1 GHz.

2. Description of Related Art

Since electromagnetic noise generating in various kinds of electronic equipment and systems may sometimes emit to free space to cause interference with the functions of other equipment, recent years have seen increasing levels of attention paid for electromagnetic dichotomy through suppression of such electromagnetic radiation (or radiated emission) and improvement of interference elimination capability, that is, EMC (Electro-Magnetic Compatibility). As methods of measuring such electromagnetic radiation, the following are known on the basis of the measuring standards of ANSI (American National Standards Institute).

An example of a conventional method for measuring electromagnetic radiations is shown schematically in FIGS. 11A and 1113. FIG. 11A illustrates a method for spiral-shaped sampling, while FIG. 11B shows a method for round sliced sampling.

This measuring method is typically conducted in a anechoic chamber, and the equipment under test (hereafter referred to as the "EUT") 102 is placed on a turntable 105, which is revolved through 360 deg at a rate of over 5 rpm, an antenna 103 receiving while being moved up in the perpendicular direction at a height ranging from 1 m to 4 m, the measurement being conducted by obtaining a maximum field intensity of the electromagnetic radiation. This measuring can be considered virtually equal to the condition wherein a surface of a cylindrical plane 105a with the turntable 105 in the center is being scanned by the antenna 103, as schematically shown in FIGS. 11A and 11B. For example, when the antenna 103 is moved in the perpendicular direction while turning around the turntable 105, continuous sampling is performed in the spiral shape as illustrated in FIG. 11A, while in the case of holding the height of the antenna 103 at a fixed interval, sampling is conducted in the manner of cutting in round slices per fixed height as illustrated in FIG. 11B. Now, when a maximum value measured in such measuring exceeds the specified value, a decision of "Inappropriate" is given.

It should be mentioned that insofar as electromagnetic radiations of more than 1 GHz are concerned, as a result of effects of reflected waves from a metallic ground plane comprising the bottom of the anechoic chamber, the electromagnetic waves draw very fine height patterns. An example of the height pattern due to a horizontal polarization of 3 GHz is illustrated in FIG. 12, and an example of the height pattern due to a horizontal polarization of 5 GHz is shown in FIG. 13.

As shown in FIG. 12 and FIG. 13, since the peaks of the electric field values appear minutely with respect to the perpendicular direction in these electromagnetic radiations, in the case of a measuring method of obtaining the maximum radiation level per frequency by rotating the aforementioned turntable 105 at a high speed of more than 5 rpm, there is an extremely good possibility that the maximum peak is overlooked, which results in an inaccurate measurement.

This point is taken into consideration by ANSI which describes the following measuring method for measuring the electromagnetic radiation of over 1 GHz as an empirical technique, urging that due caution be exercised in the measurement thereof. For instance, after a horn antenna is moved close to the vicinity of the EUT, ascertaining the direction of intense noise radiation, measurements are made with respect to the range thereof by changing the antenna's position per specified height.

Yet, a fact remains that this conventional measuring method calls for a great deal of time determining the range of strong noise radiation and searching for angles. For example, this measurement generally takes over 40 minutes by an operator well experienced in this measurement and more than an hour by a designer of the EUT 102, thus requiring a plurality of operators to shorten the time. There is an additional disadvantage in that the beam characteristic is sharp in the height direction, which very likely results in that the designer with no measuring skills would overlook the peak value without performing accurate measurements.

SUMMARY OF THE INVENTION

The present invention is directed to resolving the foregoing problems inherent in the conventional technique. It is therefore an object of the present invention to provide an electromagnetic radiation measuring apparatus which can measure an electromagnetic radiation of more than 1 GHz accurately and in a short time.

It is another object of the present invention to provide a method for measuring the electromagnetic radiation which can measure an electromagnetic radiation of more than 1 GHz accurately and in a short time.

According to the present invention, there is provided an electromagnetic radiation measuring apparatus for measuring electromagnetic radiations from electronic equipment including: detection means for detecting the electromagnetic radiation; perpendicular drive means for driving the detection means in a perpendicular direction; rotary drive means for driving the electronic equipment revolvingly; field intensity measuring means for measuring a field intensity of each frequency from a detection signal of the detection means; data analysis means for analyzing measured data of the field intensity and for outputting a maximum field intensity of each frequency with respect to all measured data or a direction characteristic of the field intensity at the preceding frequency; and measurement control means for exerting control for revolving and stopping the rotary drive means per specified angle, moving the detection means within a range of a specified height by the perpendicular drive means upon suspension of revolution, causing the field intensity measuring means to receive the detection signal continuously during the movement of the receiving means, calculating the frequency spectrum based on the maximum field intensity of each frequency per suspension of revolution, and causing the data analysis means to receive the frequency spectrum due to be subsequently subjected to analysis.

In the electromagnetic radiation measuring apparatus of this arrangement, the measuring control means operates so that the electronic equipment is revolved per specified angle by the rotary drive means, the detection means being moved by the perpendicular drive means in the perpendicular direction per suspension of revolution so as to continuously detect electromagnetic radiations, the frequency spectrum based on the maximum of each frequency being automatically measured by the field intensity measuring means, wherefore the electromagnetic radiation measurement can be performed with high accuracy and in a short time without overlooking the point wherein the radiate emission reaches its maximum.

Moreover, according to the electromagnetic radiation measuring method of the present invention for measuring electromagnetic radiations from the electronic equipment, there is provided a method of measuring electromagnetic radiations which moves revolvingly the electronic equipment mentioned above per specified angle, detects the electromagnetic radiations continuously in the perpendicular direction within the range of a specified height upon suspension of revolution, calculates the frequency spectrum which recorded the maximum field intensity of each frequency per suspension of revolution, analyzes the maximum field intensity of each frequency with respect to all measured data as well as the direction characteristic of the field intensity at each frequency described above, and outputs such results.

In the above-mentioned electromagnetic radiation measuring method, since the electronic equipment is revolved per specified angle, electromagnetic radiations are detected continuously in the perpendicular direction within the range of the specified height per suspension of revolution, the frequency spectrum based on the maximum field intensity of each frequency being measured automatically. Therefore, there is no overlooking the point wherein the electromagnetic radiation reaches its maximum, and the electromagnetic radiation measurement can be performed with high accuracy and in a short time.

As the described above, the embodiment of the present invention is shown by illustrating an electromagnetic radiation measuring apparatus, in which by dint of the control exerted by the measuring control means, the rotary drive means revolves the electronic equipment per specified angle, the perpendicular drive means moving the detection means in the perpendicular direction per suspension of revolution for continuous detection of electromagnetic radiations, the field intensity measuring means automatically measuring the frequency spectrum based on the maximum of each frequency, so that the point where the electromagnetic radiation becomes a maximum is not overlooked, enabling electromagnetic radiations to be measured with high accuracy and in a short time.

Also, the embodiment of the present invention is shown by illustrating an electromagnetic radiation measuring method, since the electronic equipment is revolved per specified angle, electromagnetic radiation is detected continuously per suspension of revolution in the perpendicular direction in the range of the specified height, and the frequency spectrum based on the maximum of each frequency is automatically measured, the point where the electronic radiation becomes a maximum is not overlooked, enabling electromagnetic radiations to be measured with high accuracy and in a short time.

BRIEF DESCRIPTION OF THE DRAWINGS

Other objects, features and attendant advantages of the present invention will be more fully appreciated as the same become better understood from the following detailed description when considered in connection the accompanying drawings, in which:

FIG. 3 a schematic view of a method of measuring the electromamagnetic radiation by an antenna;

FIG. 5A showing a result when a rotary angle of a turntable is 0 deg; FIG. 5B showing a result when the rotary angle of the turntable is 20 deg; and FIG. 5C showing a result when the rotary angle of the turntable is 40 deg;

DETAILED DESCRIPTION OF THE PREFERRED EMBODIMENT

An embodiment of the present invention will now be described below with reference to the accompanying drawings.

Figure 1:
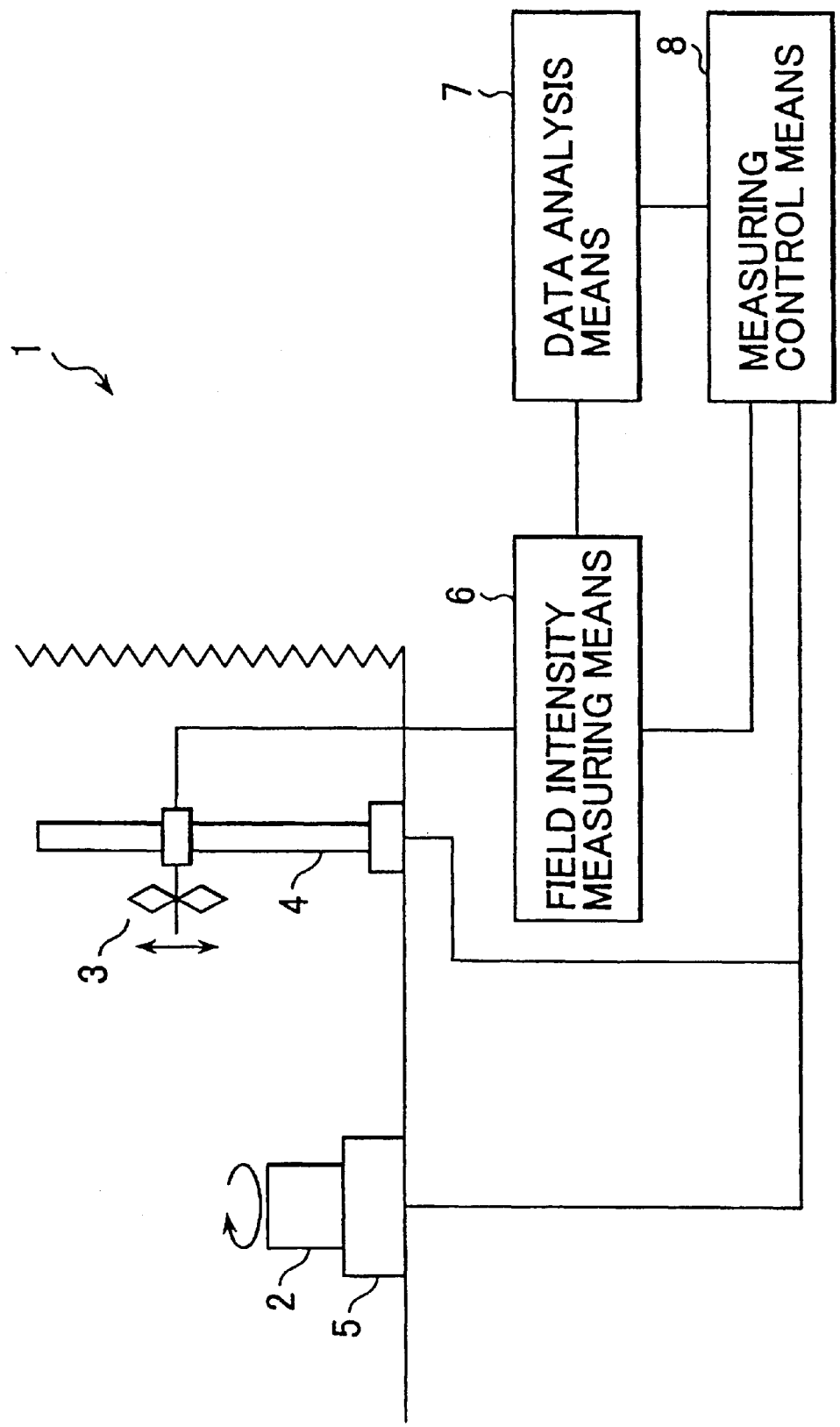
FIG. 1 is a block diagram showing a main construction of an electromagnetic radiation measuring apparatus according to the present invention.

FIG. 1 is a block diagram showing a main construction of an electromagnetic radiation measuring apparatus according to the present invention.

An electromagnetic radiation measuring apparatus 1 measures the maximum radiation level for each frequency per suspension of revolution by revolving electronic equipment 2, being an EUT (equipment under test), by each arbitrary angle, such measured value being used to obtain the maximum field intensity radiated by the electronic equipment 2 and the directionality of a main lobe. The electromagnetic radiation measuring apparatus 1 comprises detection means 3 for detecting electromagnetic radiations from the electronic equipment 2, perpendicular drive means 4 for moving the detection means 3 in a perpendicular direction, rotary drive means 5 for driving revolvingly the electronic equipment 2 disposed thereon, field intensity measuring means 6 to measure a field intensity of the electromagnetic radiation from a detection signal of the detection means 3, data analysis means 7 for analyzing output data from the field intensity measuring means 6 and outputting the results of specified measurements, and measurement control means 8 for controlling the drive of the perpendicular drive means 4 and the rotary drive means 5, measurements and data output of the field intensity measuring means 6, and processing of analysis of the data analysis means 7.

The electronic equipment 2, the detection means 3, the perpendicular drive means 4, and the rotary drive means 5 are normally installed inside an anechoic chamber, the detection means 3 being an antenna or the like. The field intensity measuring means 7, being installed in a space under the floor of the anechoic chamber, is comprised of a spectrum analyzer or the like which analyzes detection signals from the detection means 3 by each component of the frequency and outputting the frequency spectrum. The data analysis means 7 and the measurement control means 8 are stored as a program, for example, in a computer storage device placed outside the anechoic chamber, and realized through execution of this program.

According to the measurement by the electromagnetic radiation measuring apparatus 1, under the control of the measurement control means 8, the electronic equipment 2 is revolved per specified angle up to 360 deg by the rotary drive means 5, the detection means 3, while the revolution stops per angle, being perpendicularly driven by the perpendicular drive means 4 within the range of the specified height and carrying out detection continuously while the same is being driven, thus automatically detecting the electromagnetic radiations from the circumference of the electronic equipment 2 to virtually all directions. The field intensity measuring means 6 records a maximum value of the field intensity according to the detection signal from the detection means 3 per frequency, conveying the frequency spectrum based on this maximum value of the field intensity to the data analysis means 7 per suspension of revolution at each angle, the data analysis means 7 analyzing the frequency spectrum data and outputting the frequency spectrum which recorded the maximum value of the field intensity around the entire circumference of the electronic equipment 2, and a radar chart or the like indicating the direction characteristic of the field intensity in the horizontal direction or the like Note that a rotary angle from one suspension to the next suspension of the rotary drive means 5 is appropriately set in accordance with the detection direction characteristic of the detection means 3. Further, the field intensity measuring means 6 is placed under the ground plane of the anechoic chamber, together with an RF (Radio Frequency) amplifier to be connected between the detection means 3 and the same, for instance, to minimize loss of detection signals by the detection means 3, whereas data transmission from the field intensity measuring means 6 to the data analysis means 7 is conducted via coaxial cable, optical fiber, and a repeater or the like compatible with high-speed communication in order to avoid delay. Moreover, while frequency spectrum data generated by the field intensity measuring means 6 are being transmitted to the data analysis means 7, the measurement control means 8 exerts control so that the electronic equipment 2 is revolved by the rotary drive means 5, thereby shortening the measuring time.

Figure 2:
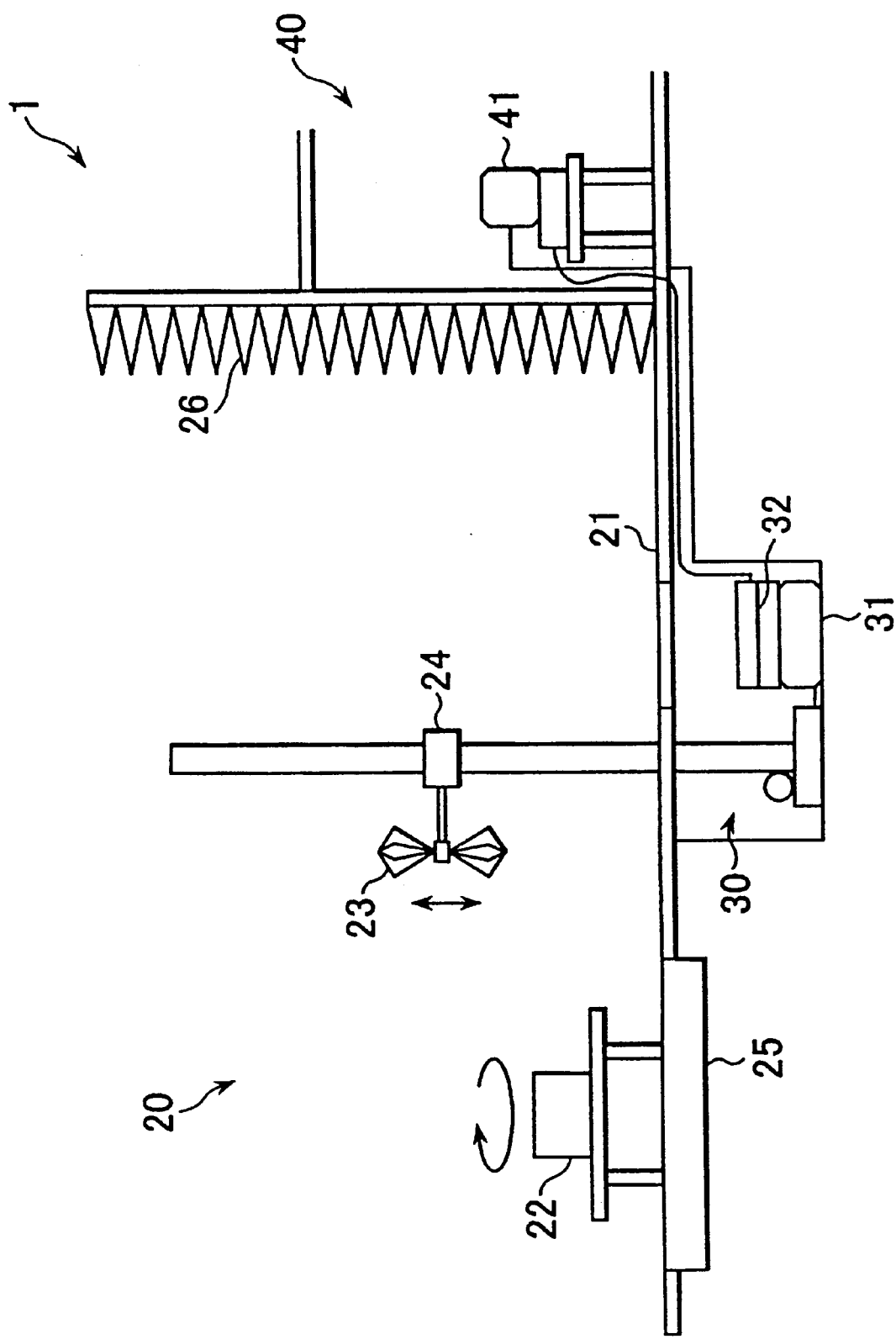
FIG. 2 is a diagram showing an example of an arrangement of equipment of the electromagnetic radiation measuring apparatus of the present invention.

Next, referring to FIG. 2, an example of an arrangement of the equipment for the electromagnetic radiation measuring apparatus of the present invention is shown. The electromagnetic radiation measuring apparatus 1 can be realized in terms of general automatic measuring system using an anechoic chamber 20. As FIG. 2 illustrates, a turntable 25 and an antenna positioner 24 are installed on a metallic ground plane 21 in the anechoic chamber 20 around which a radio wave absorber 26 is provided, the EUT 22 such as the electronic equipment is placed on the turntable 25 and driven revolvingly, and any electromagnetic radiation while the EUT is in motion is detected by an antenna 23 which is driven in the perpendicular direction by the antenna positioner 24, thus making itself moveable. The antenna 23 is connected via an RF amplifier 31 with a spectrum analyzer 32. This RF amplifier 31 and the spectrum analyzer 32 are installed in a pit 30 provided below the ground plane 21 directly under the antenna 23 to minimize transmission loss of the detected signals thereof.

Driving of the antenna positioner 24, as well as the turntable 25, is controlled by a measuring program of a computer 41 installed in a measurement room 40 outside the anechoic chamber 20. The following procedures are used for measuring the electromagnetic radiations: the turntable 25 is revolved and suspended per specified angle; at this suspension of revolution, the antenna 23 is moved in the perpendicular direction within the range of the specified height by the antenna positioner 24; and any detection signal detected during this movement is sent to the spectrum analyzer 32. When, for instance, the EUT 22 is placed at a position of 80 cm up from the ground plane 21, the antenna 23 is moved within a range of 1 m to 4 m and the detection is carried out there.

FIG. 3 gives a schematic illustration of the receiving method of electromagnetic radiations by the antenna 23.

Detection by the antenna 23 is considered approximately the same as the circumstances in which the surface of a cylindrical plane 25a with the turntable 25 in the center as shown in FIG. 3 is being scanned by the antenna 23 in the perpendicular direction. By revolving the turntable 25 in the direction of an arrow 25c per angular step 25b and by moving the antenna 23 in the perpendicular direction when the revolution ceases, the portion of an arrow 25d of the surface of the cylindrical plane 25a is scanned by the antenna 23. As the turntable 25 is revolved through 360 deg, the entire circumference of the cylindrical plane 25a is subjected to measuring.

Now, in the measuring environment of this electromagnetic radiation, on the horizontal surface, there is the ground plane 21 which is a metal, while, on the perpendicular surface, there are no other objects showing a strong wave reflection than a power cord of the EUT 22, the coaxial cable connected with the antenna 23, and the mutually connected equipment, so that the directivity of horizontal polarization of the electromagnetic radiation becomes wider than that of perpendicular polarization. In view of such circumstances, there is adopted a procedure, whereby, in the aforementioned measuring process, measurements are to be made only per angle which is needed with regard to the direction of the arrow 25c (circumferential direction) of the cylindrical plane 25a. The angular step 25b of this revolution is to be set according to such factors as the upper limit of the measuring frequency, the structure of the EUT22, and the directional characteristic of the antenna 23.

The electromagnetic radiation detected in the foregoing manner is propagated via the RF amplifier 31 to the spectrum analyzer 32 in which the frequency spectrum of the field intensity is calculated from the detection signal. The frequency spectrum is calculated from the measuring program of the computer 41 per suspension of revolution of the turntable 25, at which time the maximum value of the field intensity of each frequency is arranged to be recorded. The frequency spectrum calculated per suspension of revolution is imparted via the measuring program control to the computer 41, and the specified data analysis is carried out therein.

Figure 4:
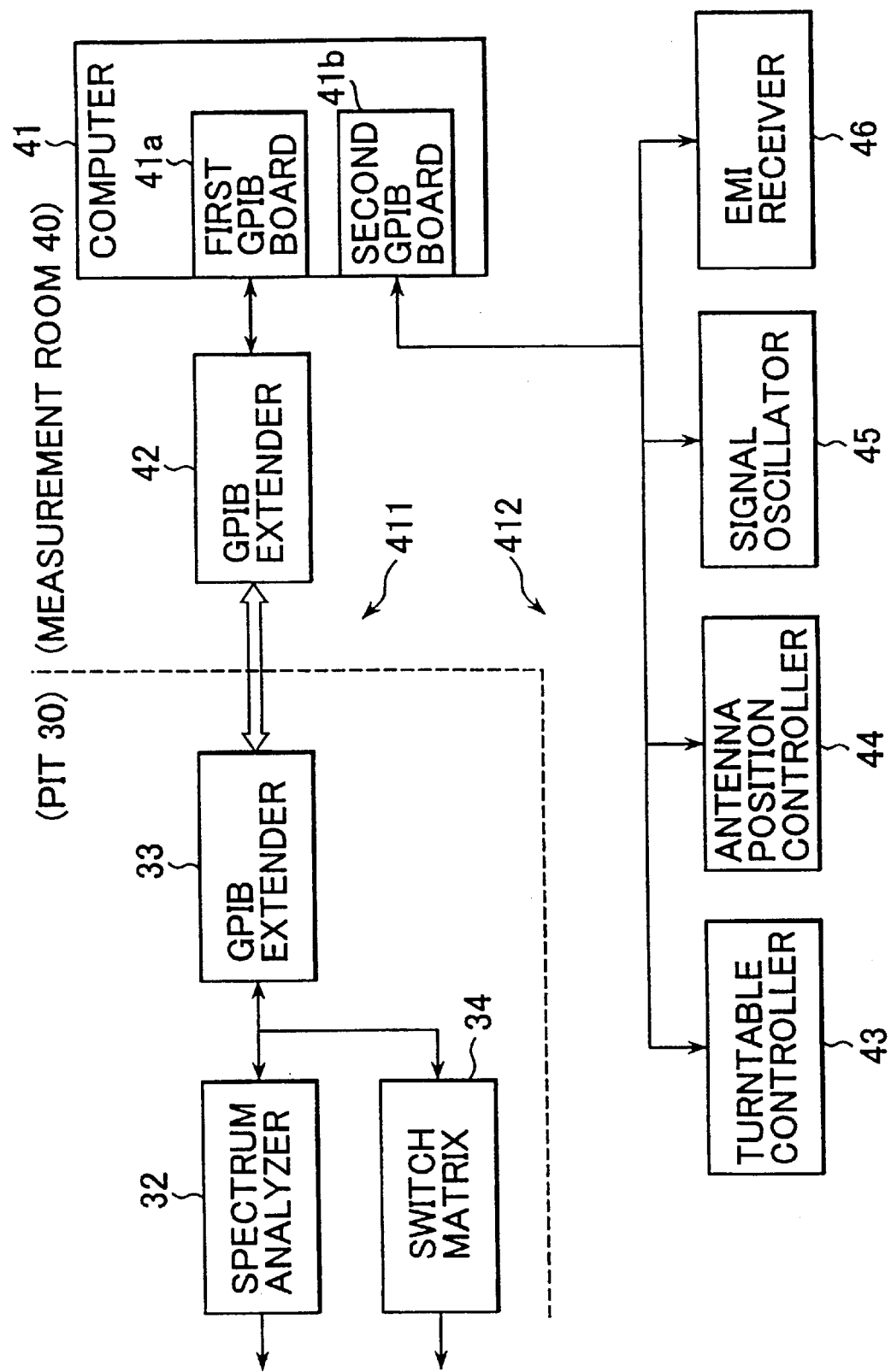
FIG. 4 is a diagram showing an example of configuration of the equipment of a measurement control system.

Now, FIG. 4 illustrates an example of a configuration of the equipment in a measuring control system.

In the measuring control system of the electromagnetic radiation measuring apparatus 1, for example, the GPIB (General Purpose Interface Bus) which is the standard of a measuring equipment connection is used, and for the control signals from the computer 41 installed in the measurement room 40 and the data transmission line, there are provided the two systems comprising a high-speed transmission system 411 via a first GPIB board 41a and a low-speed transmission system 412 via a second GPIB board 41b.

Connection between the computer 41 and the spectrum analyzer 32 is made by the high-speed transmission system 411 due to large quantities of data to be transmitted from the spectrum analyzer 32. Depending on the distance between the spectrum analyzer 32 and the computer 41, if it is longer than the specified length, GPIB extenders 33 and 42 are used for relaying to prevent any data error. The spectrum analyzer 32, the GPIB extenders 33 and 42, and the first GPIB board 41a are respectively connected by coaxial cable, while optical fiber is employed to mutually connect the GPIB extenders 33 and 42 to render them compatible with high-speed communication and to prevent the shield property of the anechoic chamber 20 from deteriorating. Note that a switch matrix 34 is provided for the purpose of rendering connection with the antenna per specified frequency band, and the connection is made by coaxial cable.

On the other hand, the second GPIB board 41b is connected via a normal GPIB cable with a turntable controller 43 regulating the rotary drive angles thereof, an antenna position controller 44 regulating the height of the antenna positioner 24, a signal oscillator 45 issuing the confirmation signal to each equipment prior to measuring to verify operation, and an EMI receiver 46 to measure electromagnetic radiations under 1 GHz, which are all installed, for example, in the measurement room 40.

Figure 5A:
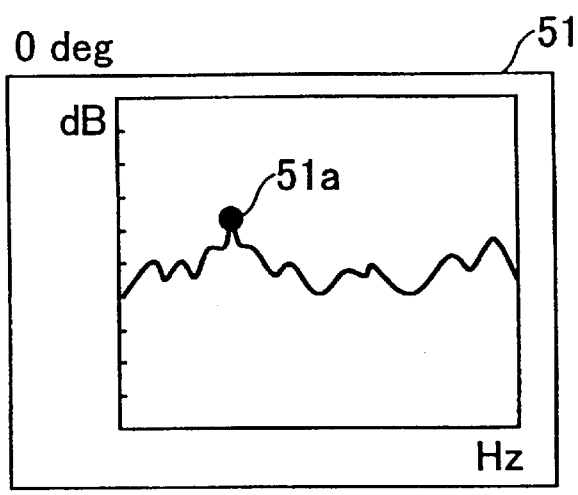
FIGS. 5A to 5C illustrate examples of the results of measuring by a spectrum analyzer.
Figure 5B:
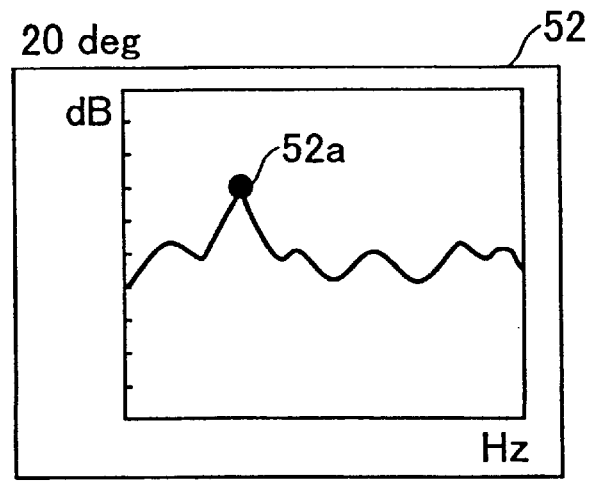
Figure 5C:
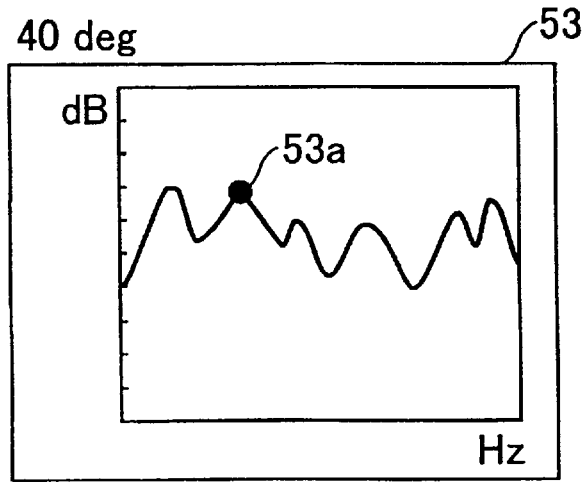
Figure 6:
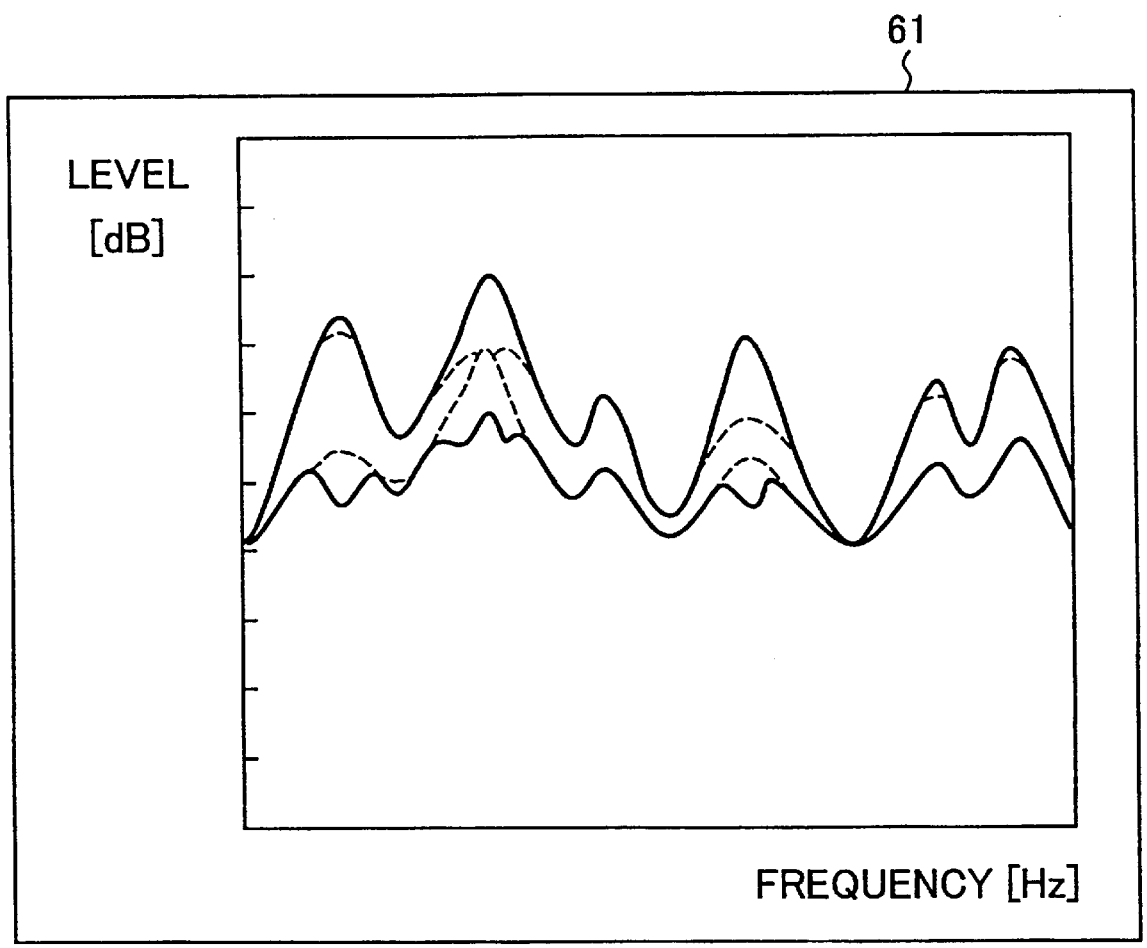
FIG. 6 is a diagram showing an example of a result of a first analysis which is a frequency spectrum as a result of measuring the entire field intensity.

Next, analysis of the measured data will be described. FIGS. 5A to 5C illustrate examples of the measurement results of the spectrum analyzer 32. FIG. 5A shows the result at 0 deg of the rotary angle of the turntable 25, FIG. 5B showing the result at 20 deg thereof, and FIG. 5C showing the result at 40 deg thereof. In addition, FIG. 6 shows an example of the result of a first analysis, that is, the frequency spectrum which is the result of measuring the entire field intensity. Further, a radar chart which is an example of the result of a second analysis is presented in FIG. 7.

FIGS. 5A to 5C illustrate the examples of the results of measurement by the spectrum analyzer 32 in which there are shown the cases of 0 deg, 20 deg, and 40 deg of the rotations of the turntable 25 as well as frequency spectra 51, 52, and 53 when the antenna 23 is moved in the range of the height from 1 m to 4 m. As previously described, the maximum value of the field intensity per rotary angle is recorded in these measured values. The measured data is sent to the computer 41 to be analyzed by the measuring program.

Figure 7:
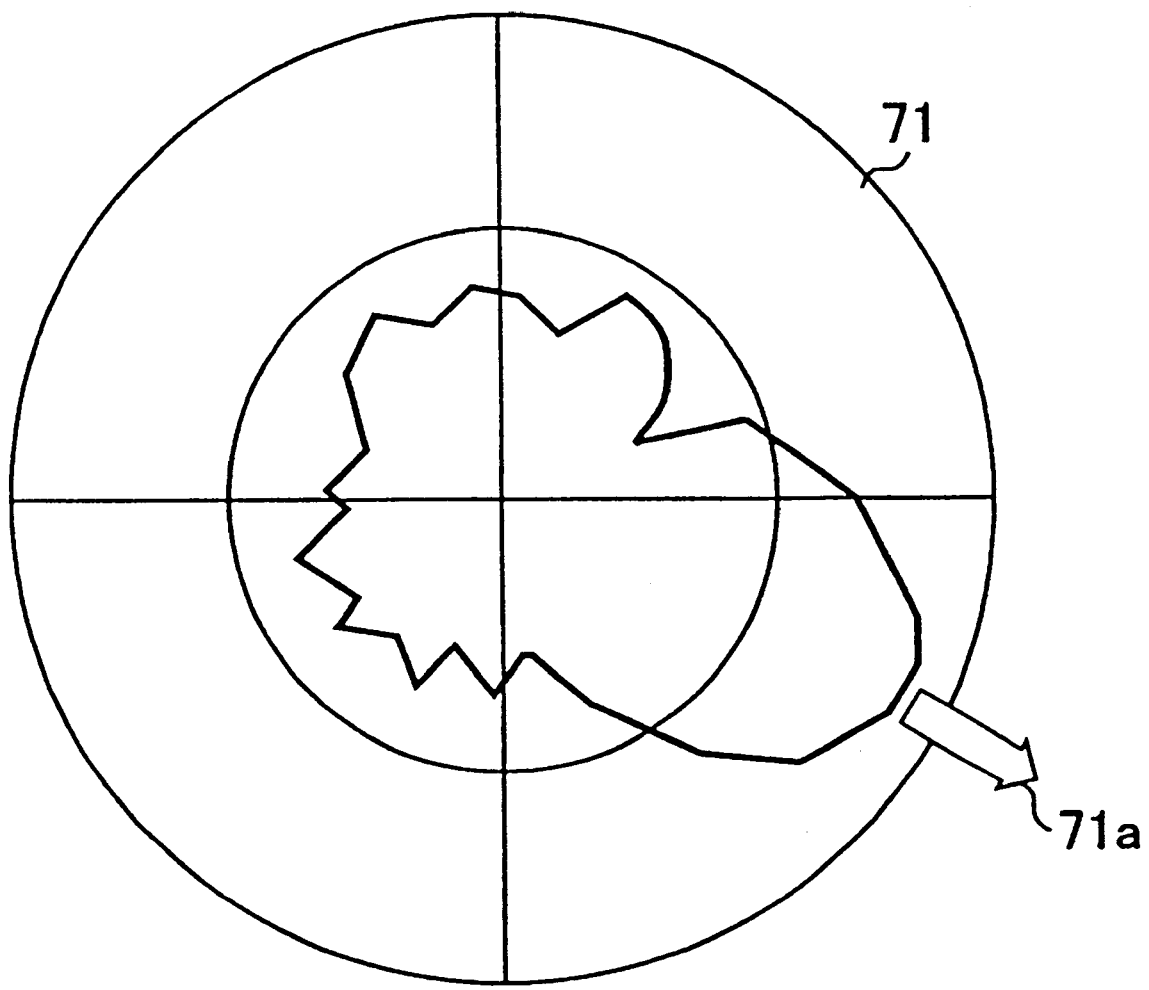
FIG. 7 is a diagram showing an example of a result of a second analysis which is a radar chart.

The result of the first analysis is the acquisition of a frequency spectrum 61 in which the maximum values at all rotary angles are recorded as shown in FIG. 6. These data make it possible to obtain the maximum field intensity of the electromagnetic radiation occurring in the EUT 22 per frequency, whereby a proper judgment of the electromagnetic radiation characteristic of the EUT 22 can be made. Also, as the result of the second analysis, for example, from the values of points 51a, 52a, and 53a representing the same frequencies of FIG. 5, there is obtained a radar chart 71 in which the field intensity per frequency at each rotary angle is recorded as shown in FIG. 7. From this radar chart 71, the directional characteristic of the electromagnetic radiation per frequency is shown, thus clarifying the direction of the main lobe shown by an arrow 71a and making it possible to easily specify any portion in which the effect of radio shield is weak.

Figure 8:
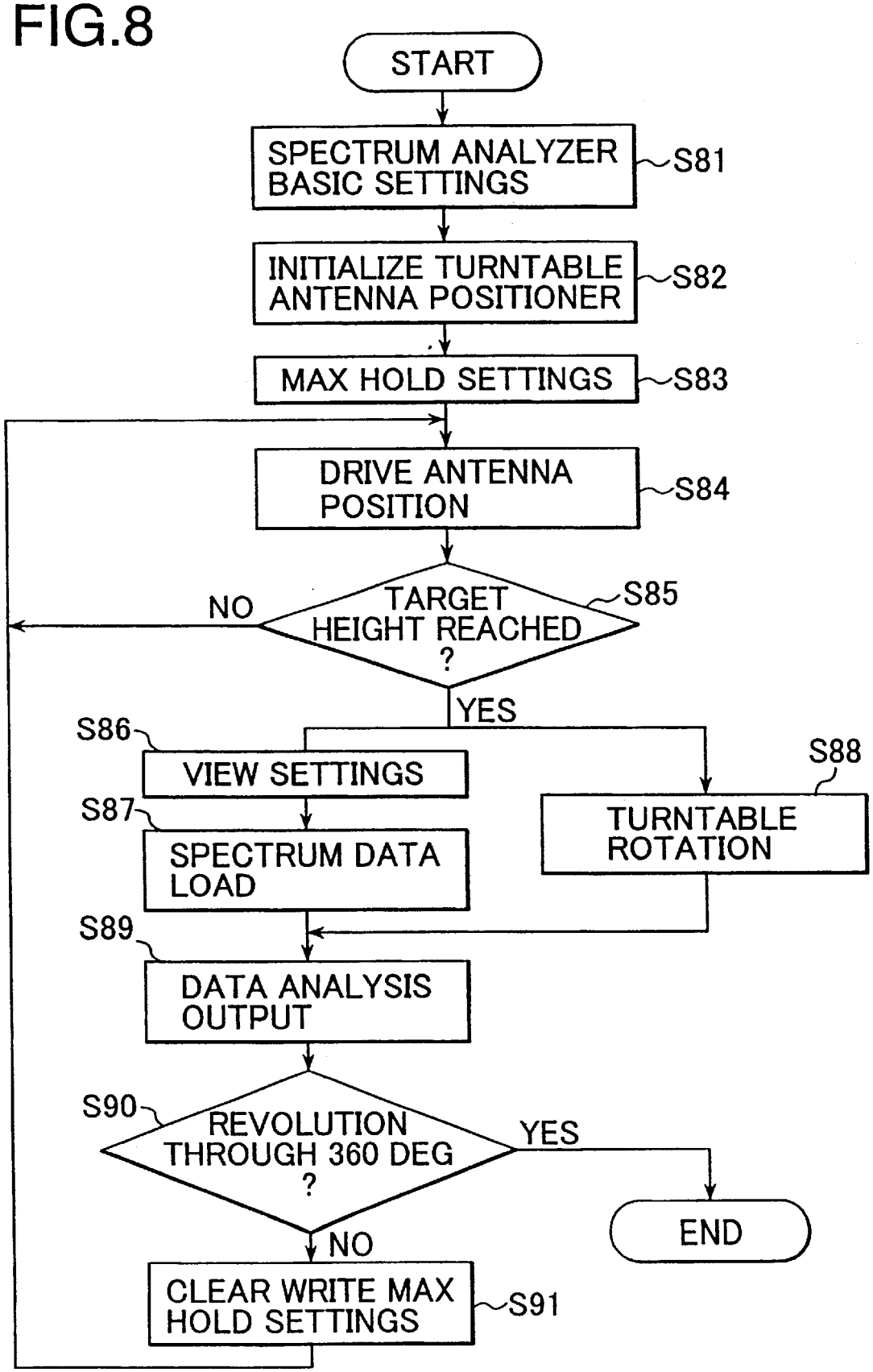
FIG. 8 is a flow chart of processing of an electromagnetic radiation measurement.

Next, FIG. 8 illustrates a processing flow of measuring the electromagnetic radiation.

When the measuring program stored in a storage device of the computer 41 is put into execution, first, a control signal is imparted to the spectrum analyzer 32, and the basic settings such as resolution, reference level, frequency, and sweep time are made (S81). This is followed by the issuing of control signals to the turntable controller 43 and the antenna position controller 44 to initialize the settings, so that the angle of the turntable 25 will be 0 deg with position of the antenna 23 at 1 m from the ground plane 21 (S82).

The measuring mode of the spectrum analyzer 32 is subsequently set at "Max Hold" which always records the maximum of a measured value (S83), then, control signals are transmitted to the antenna position controller 44, and the antenna 23 is driven at high speed until the target height of 4 m is reached (S84), whereupon the detection signal is imparted to the spectrum analyzer 32. When the antenna positioner 24 reaches the target position, the antenna position controller 44 issues a control signal indicating "Execution Completion" to the computer 41. Upon receiving this signal (S85), the computer 41 sets the measuring mode of the spectrum analyzer 32 to be a "View" mode which outputs the frequency spectrum (S86), and data on the frequency spectrum calculated by the spectrum analyzer 32 are taken in by the computer 41 (S87). Concurrently with this operation, the control signal is sent to the turntable controller 43, causing the turntable 25 to revolve for the amount of the angular step set in the manner of 10 deg, for example (S88).

After the frequency spectrum data taken in by the computer 41 are analyzed by the measuring program, charts presenting the field intensity and the directional characteristic which may be outputted by the display unit thereof or printed out by the printer (S89). At this point, note that when the turntable controller 43 gives the "Execution Completion" signal to the computer 41, if the turntable 25 is not revolving through 360 deg, yet (S90), the measuring mode of the spectrum analyzer 32 is set at "Clear Write" which clears the measured data, then, is set at "Max Hold" again (S91). Subsequently, the antenna positioner 24 is driven (S84) and the antenna 23 is moved down from a height of 4 m to that of 1 m, followed by the detection of the electromagnetic radiation. These procedures of the revolution of the turntable 25 and the movement of the antenna 23 are thereafter repeated, and when the revolution of the turntable 25 goes through 360 deg (S90), the measurement is finished.

Figure 9:
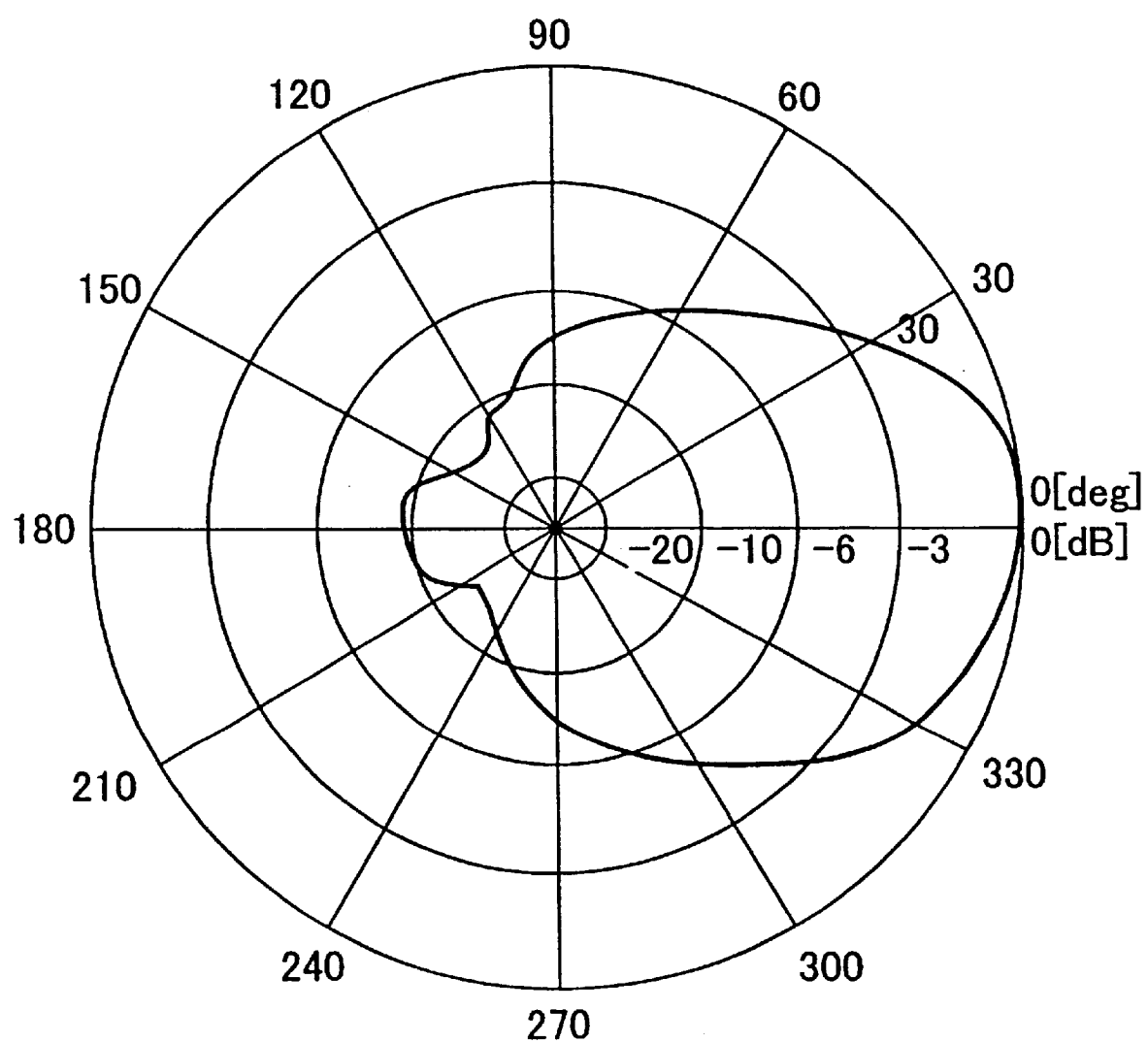
FIG. 9 is a diagram showing an example of a directional pattern of a horn antenna when a detection wave is 1 GHZ.
Figure 10:
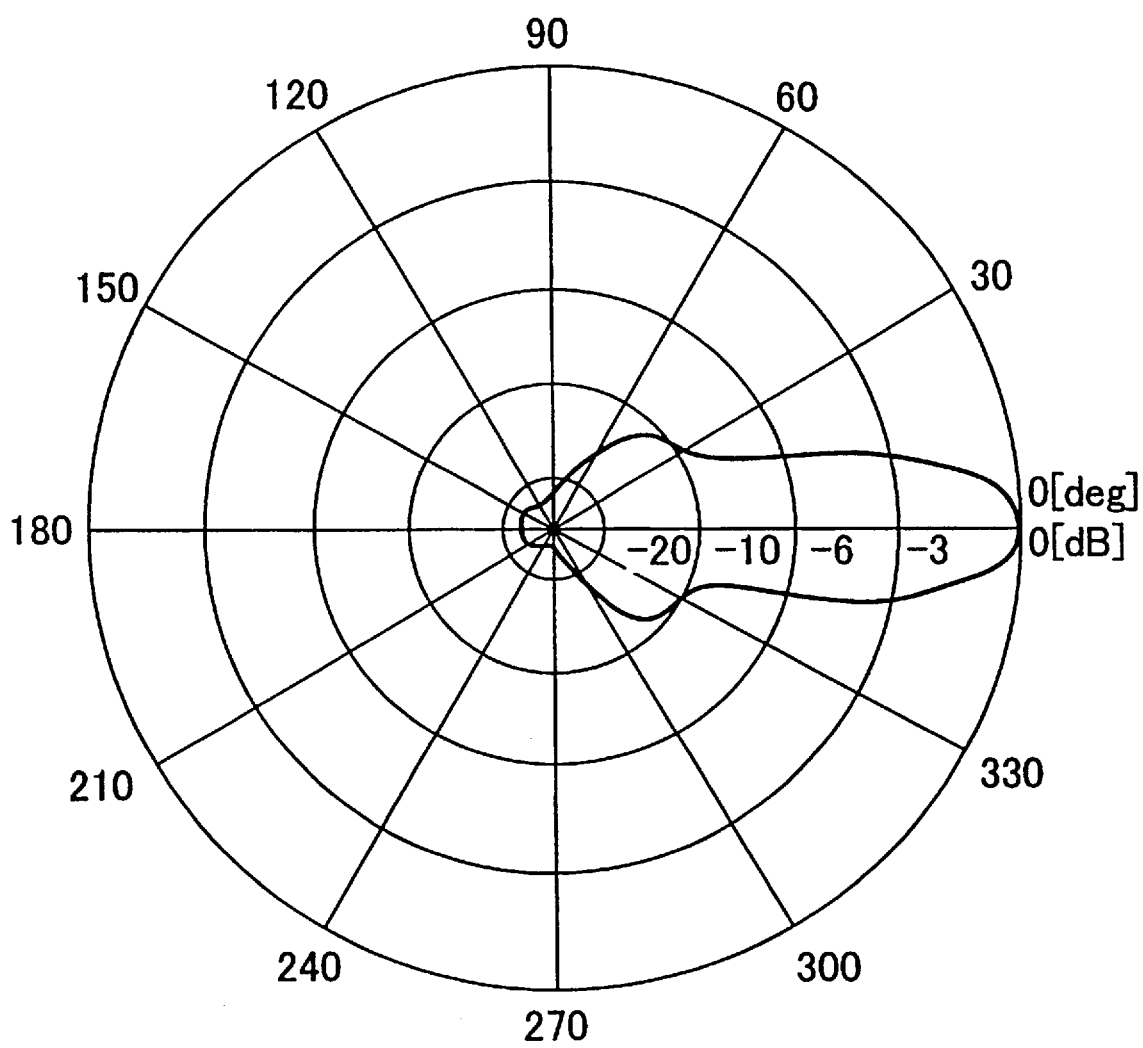
FIG. 10 is a diagram showing an example of the directional pattern of the horn antenna when the detection wave is 5 GHz FIGS. 11A and 11B schematically illustrate examples of a conventional method of measuring the electromagnetic radiation.
Figure 11A:
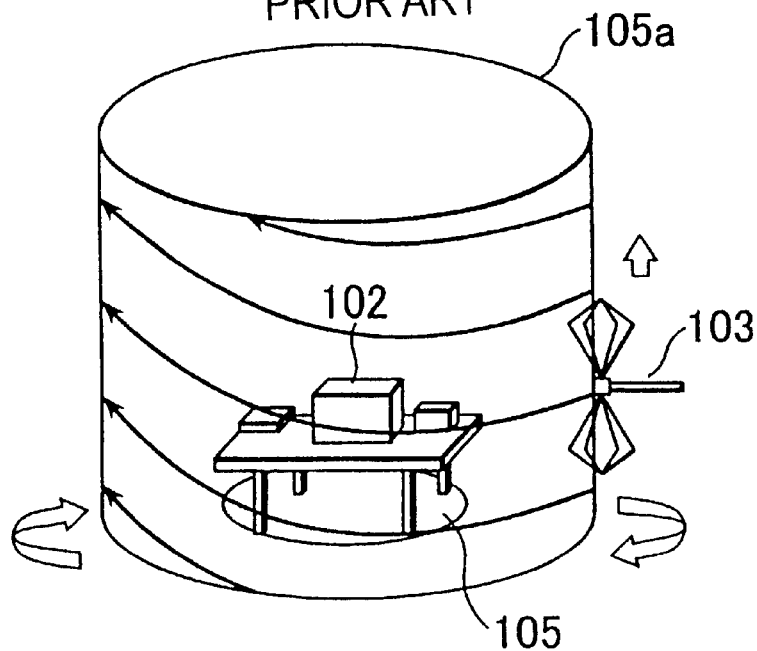
FIG. 11A shows a method of spiral-shaped sampling.
Figure 11B:
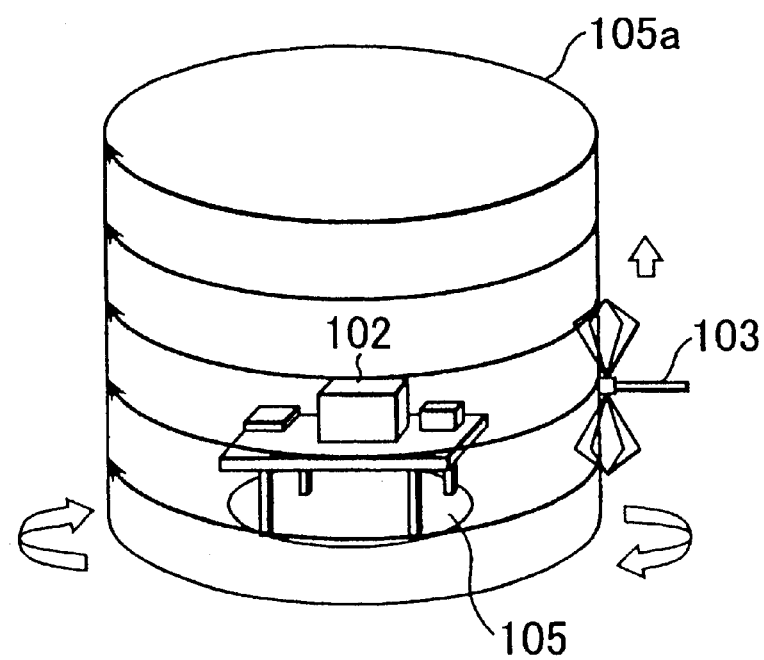
FIG. 11B shows a method of round sliced sampling.
Figure 12:
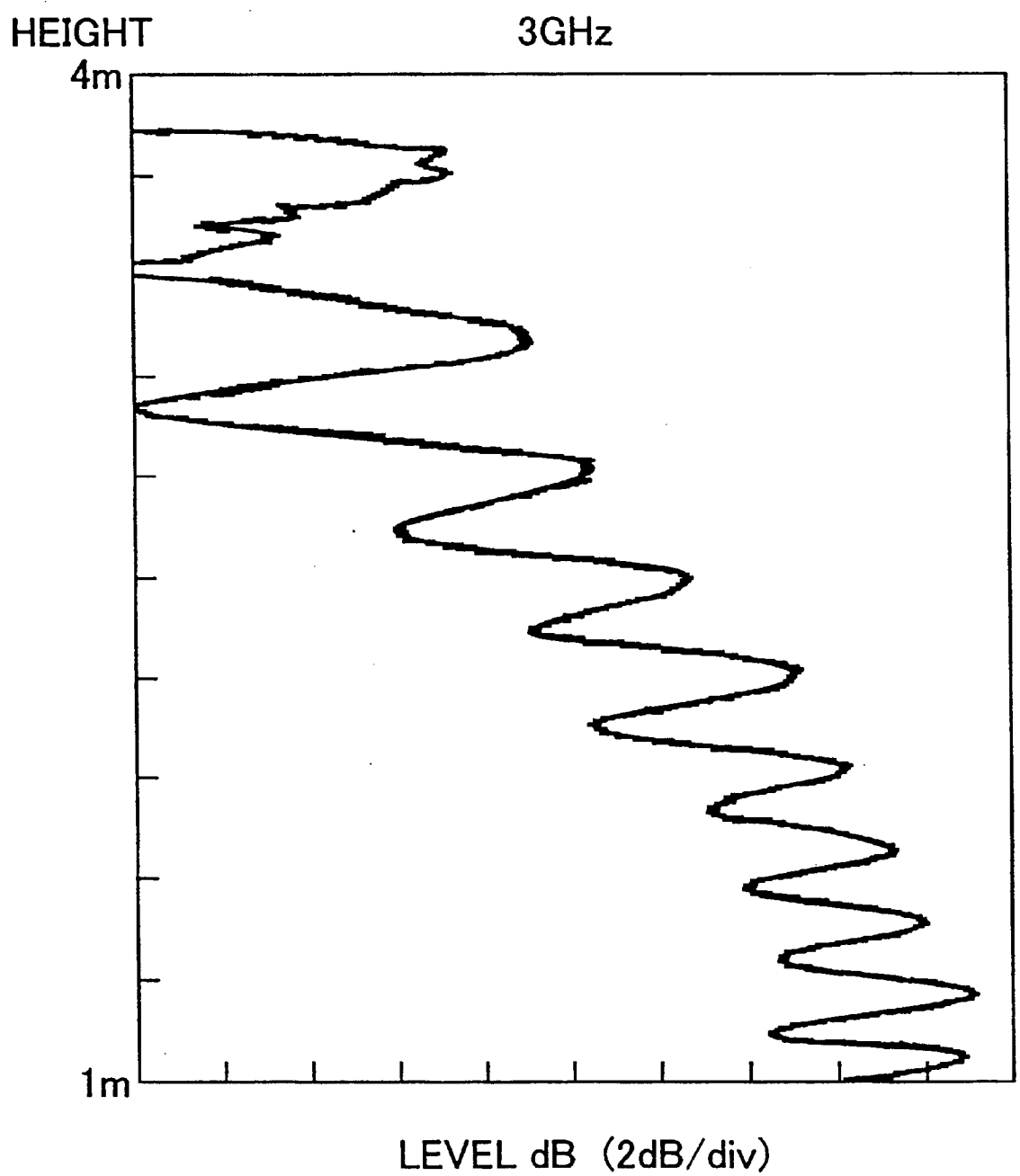
FIG. 12 is a diagram showing an example of a height pattern due t a horizontal polarization of 3 GHz.
Figure 13:
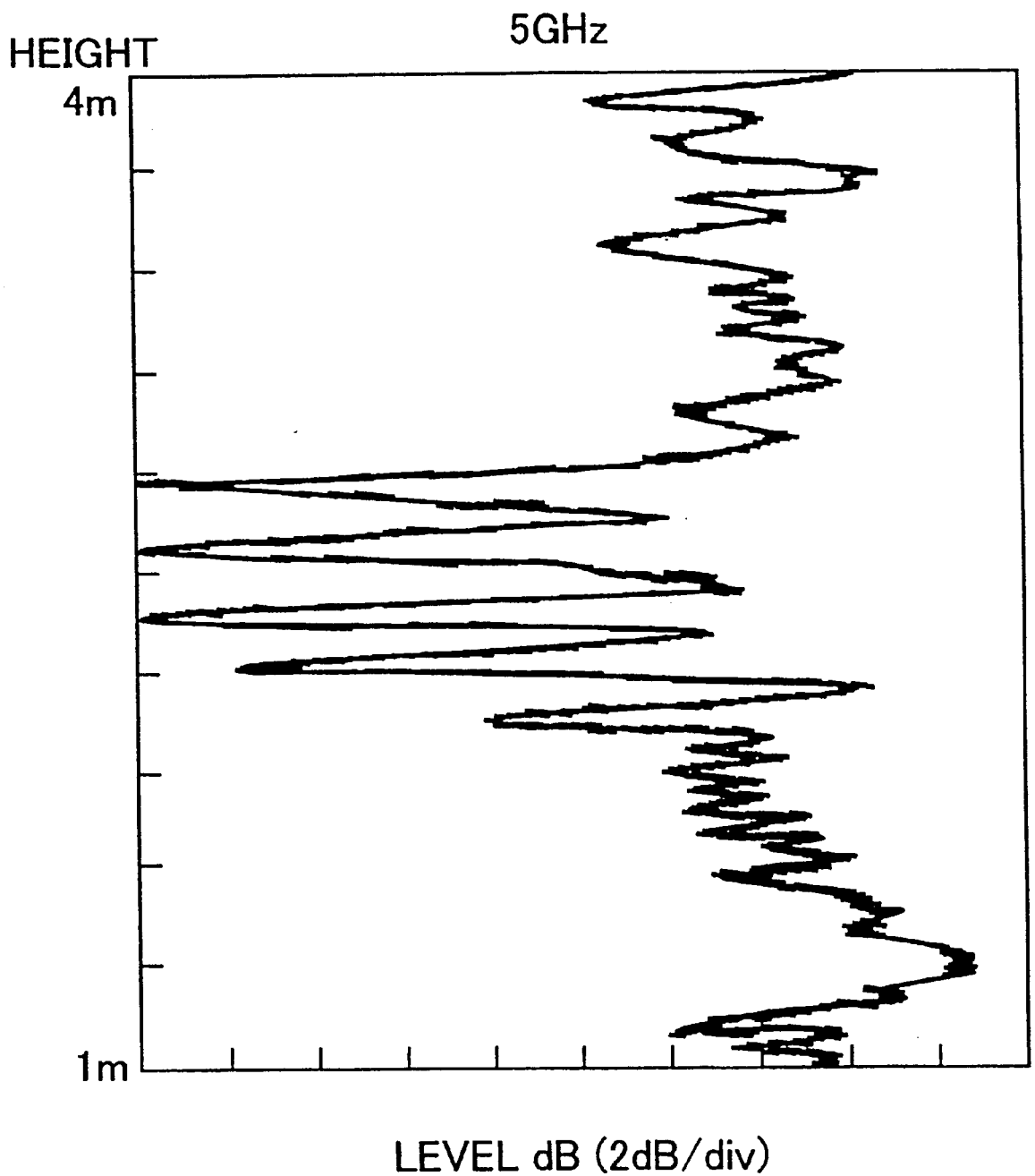
FIG. 13 is a diagram showing an example of a height pattern due to a horizontal polarization of 5 GHz.

A rough estimate of the time required for such measurement is next carried out. An electromagnetic radiation of over 1 GHz is generally measured by means of the horn antenna which can also be used as the antenna 23 for the measurement mentioned above. FIG. 9 and FIG. 10 show examples of the directional characteristics of the horn antenna. The case of a detection wave of 1 GHz is shown in FIG. 9, while the case of 5 GHz is illustrated in FIG. 10.

In this example of the horn antenna, when the detection wave is 1 GHz as shown in FIG. 9, the peak of 3 dB is approx. 40 deg, whereas in the case of 5 GHz as shown in FIG. 10, it is about 10 deg. Consequently, in the aforementioned measurement, so long as the angular step 25b for the turntable 25 to revolve is under this angle, it is possible to cover the detection range over the entire circumference of the cylindrical plane 25a. Take, for instance, a case of measuring the equipment such as a computer having an upper limit frequency of 5 GHz, it is regarded to be appropriate to take the rotary angular step as about 10 deg in this measurement.

In consideration of the foregoing, a rough estimate of the measuring time in the case of taking the rotary angular step as 5 deg is made at this point, where the rotary angular step is 5 deg, the range of the upward and downward movement of the antenna 23 is 1 m to 4 m, the time for the antenna 23 to move up and down per angular step at a rate of 30 cm/s is 15 sec, and the data transmission time of the spectrum analyzer 32 is 2 sec. If the measured frequency is not divided, the total measuring time is expressed by Measuring time=(2+15)×360/5=1224 sec About 20 minutes is thus obtained. Since the existing measuring method calls for over some 40 minutes of the measurement by an expert, the measurement described above according to the embodiment of the present invention cuts the measuring time into approximately half. Another advantage of the embodiment of the present invention is that it is possible to acquire measuring data of high reliability in such a short time regardless of knowledge and measuring skills of the measurement personnel pertaining to the electromagnetic radiation in the GHz band.

Moreover, the above-mentioned measurement is based on the premise that all measurements shall be carried out according to the range specified by the standards of the measuring apparatus. Nevertheless, when the actual electromagnetic radiation and the directional characteristic of the antenna 23 are taken into account, it is possible to measure according to the method described below, thus enhancing the measuring efficiency.

First, when the EUT 22 is at a height of 80 cm from the ground plane 21, suppose the antenna 23 is set at a high position of 4 m, for example. Then, even if the direction of the main lobe should match, the sensitivity of the antenna 23 would decrease by more than about 10 dB at such a high position thus to make it extremely difficult to catch the electromagnetic radiation well. As a result, the range of measuring height is generally set at a range from 1 m to 2.5 m. Next, after the rotary angular steps are made a little large, the 360-degree circumference of the EUT 22 is subjected to rough measuring. Then, the range of angles which show strong electromagnetic radiations is selected therefrom, so that a detailed measurement regarding the above-mentioned range is conducted by making the rotary angular steps small.

The time necessary for conducting this series of measurement is roughly estimated, where the rotary angular step at the time of initial rough measurement is 20 deg, the rotary angular step at the time of next measuring the specified range is 5 deg, the range of the upward and downward movement of the antenna 23 is 1 m to 2.5 m, the time for moving up and down per angular step is 5 sec, and the data transmission time of the spectrum analyzer 32 is 2 sec:

Measuring time=overall measurement+moving time (maximum) to the specified range+measurement in the specified range=(5+2)× 360/20+8+(5+2)×20/5=162 sec Approximately 3min is obtained, enabling an efficient measurement to be accomplished in about one-tenth of the time required for the conventional method.

Although the invention has been described in its preferred form with a certain degree of particularity, obviously many changes and variations are possible therein. It is therefore to be understood that the present invention may be practiced than as specifically described herein without departing from scope and the sprit thereof.

What is claimed is:

1. An electromagnetic radiation measuring apparatus for measuring an electromagnetic radiation from electronic equipment comprising:
   an electromagnetic radiation reception element;
   drive means for driving said reception element in a direction that is parallel to an axis of rotation of the electronic equipment;
   rotary drive means for driving said electronic equipment around said axis of rotation;
   field intensity measuring means for measuring a field intensity of electromagnetic radiation received from said reception element over a range of frequencies;
   data analysis means for analyzing field intensity data; and
   measurement control means for rotating said rotary drive means through a specified angle and suspending revolution of the rotary drive a plurality of times for each of a plurality of angles, and moving said reception element in a direction that is parallel to an axis of rotation of the electronic equipment while also measuring the electromagnetic radiation across a range of travel of the reception element in the direction parallel to the axis of rotation during each period when the motion of the rotary drive is suspended.

2. The electromagnetic radiation measuring apparatus according to claim 1, wherein said field intensity measuring means is placed directly under said reception element; and under a bottom of an anechoic chamber in which measurements is conducted.

3. The electromagnetic radiation measuring apparatus according to claim 1, wherein said field intensity measuring means and said data analysis means are connected by way of a high-speed transmission line.

4. The electromagnetic radiation measuring apparatus according to claim 3, wherein a coaxial cable is used as said high-speed transmission line.

5. The electromagnetic radiation measuring apparatus according to claim 3, wherein an optical fiber is used as said high-speed transmission line.

6. An electromagnetic radiation measuring method for measuring the electromagnetic radiation from electronic equipment, said electromagnetic radiation measuring method comprising the steps of:
   rotating said electronic equipment and periodically stopping the rotation at a plurality of predetermined angles;
   detecting said electromagnetic radiation across a range of motion of a reception element that is parallel to an axis of rotation of the electronic equipment; and
   calculating from a detection signal over a frequency spectrum a maximum field intensity for each suspension of revolution.

* * * * *